United States Patent
Cima et al.

(10) Patent No.: US 7,009,390 B2
(45) Date of Patent: Mar. 7, 2006

(54) METHOD AND DEVICE FOR CHARACTERIZING FERROELECTRIC MATERIALS

(75) Inventors: Lionel Cima, Sceaux (FR); Eric Laboure, Cachan (FR)

(73) Assignees: Centre Nationa de la Recherche Scientifique-CNRS, Paris (FR); Ecole Normale Superieure de Cachan, Cachan (FR)

(*) Notice: Subject to any disclaimer, the term of this patent is extended or adjusted under 35 U.S.C. 154(b) by 0 days.

(21) Appl. No.: 10/528,395

(22) PCT Filed: Sep. 16, 2003

(86) PCT No.: PCT/FR03/02729

§ 371 (c)(1),
(2), (4) Date: Mar. 18, 2005

(87) PCT Pub. No.: WO2004/029638

PCT Pub. Date: Apr. 8, 2004

(65) Prior Publication Data

US 2005/0248973 A1    Nov. 10, 2005

(30) Foreign Application Priority Data

Sep. 27, 2002    (FR) .................... 02 11990

(51) Int. Cl.
*G01R 33/12* (2006.01)
*G11C 11/22* (2006.01)

(52) U.S. Cl. .............. 324/211; 324/210; 365/145
(58) Field of Classification Search ............ 324/211, 324/210; 365/145, 201
See application file for complete search history.

(56) References Cited

U.S. PATENT DOCUMENTS

| 2,888,641 A | * | 5/1959 | Lord .................... 324/239 |
| 4,649,495 A | * | 3/1987 | Cagan et al. ............. 324/239 |
| 5,262,983 A | | 11/1993 | Brennan ................ 365/145 |
| 6,100,685 A | * | 8/2000 | Kim et al. .............. 324/223 |

OTHER PUBLICATIONS

International Search Report for corresponding PCT Patent Application Serial No. PCT/FR2003/02729.
Mayergoyz, "Mathematical Models of Hysteresis (Invited)," *IEEE Transaction on Magnetics*, vol. MAG-22, No. 5, pp. 603-608, Sep. 1986.

* cited by examiner

*Primary Examiner*—Andrew Q. Tran
(74) *Attorney, Agent, or Firm*—Marshall, Gerstein & Borun LLP

(57) ABSTRACT

The invention relates to a method for characterizing a ferroelectric material, comprising application of an electric voltage to a sample of said ferroelectric material, measuring the electric current flowing through said sample, and joint treatment of the applied voltage signal and the measured current signal in order to provide representation data characterizing the polarization of the ferroelectric material. The method also includes controlling the applied electric voltage in such a way that superpositioning can be performed for a first current component having a large signal amplitude at a first frequency and a second current component having a second small signal amplitude at a second frequency which is much greater than the first frequency, and identifying the characteristics of the ferromagnetic material respectively associated with locally reversible polarization effects and locally irreversible polarization effects. The invention can be used for scientific instrumentation equipment and in material production lines.

3 Claims, 2 Drawing Sheets

METHOD AND DEVICE FOR CHARACTERIZING FERROELECTRIC MATERIALS

FIELD OF THE DISCLOSURE

The present invention relates to a method for characterizing ferroelectric materials. It also relates to a device implementing this method.

BACKGROUND OF THE DISCLOSURE

Ferroelectric materials are characterized by hysteresis loops of the volume polarization density P (in $C/m^2$) as a function of the electric field E (in V/m). Current characterization instruments are used to extract simple parameters specific to these loops. Conventionally, the loops are described by a remanent polarization (the polarization in zero field), a maximum polarization, a coercive field and a bias field.

The shape of the hysteresis loops is however very complex and is closely connected with the amplitude of the applied electric field within the material, with the process for producing the material, with the presence of defects within the material, with the measurement frequency, etc. A considerable amount of information is therefore concealed if the determination is limited to only a few parameters.

A theoretical model was proposed by F. Preisach in the article entitled "Über die Magnetische Nachwirkung [*On Magnetic Hysteresis*]", Z. Phys. 94, 277–302 (1935), for completely representing the shape of the hysteresis loop via a complete switching density, called the Preisach density.

The precise experimental determination of this Preisach density relies on a mathematical principle disclosed for example in the article entitled "Mathematical models of hysteresis", *IEEE Trans. Magn.* MAG-22, 603–608 (1986) by I. D. Mayergoyz.

This determination requires a very large number of loop measurements, and then data processing. At the present time, the measurement methods applied to determining this Preisach density use only a few measurements and rely on an a priori assumption about the form of this density. These are referred to as analytical methods.

A ferroelectric material is generally a good dielectric, the small-signal behavior of which is nonlinear. This behavior is described by the "butterfly" effect of the small-signal capacitance as a function of the quiescent electric field. These effects cannot be modeled by a Preisach density and must therefore be eliminated. The polarization P(E) must therefore be split into two effects (Equation 1), one $P_{rev}(E)$ being locally reversible and the other $P_{irr}(E)$ being locally irreversible. The locally reversible effects are accessible by measuring the small-signal capacitance. Only the locally irreversible effects can be modeled by a Preisach density. Perfect separation of these two effects cannot be envisaged using current characterization methods:

$$P(E)=P_{rev}(E)+P_{irr}(E) \quad (1)$$

The locally irreversible polarization represents the ferroelectric domain switching state, or in other words the position of the domain walls. Domain wall displacements are subject to a certain dynamic behavior that introduces complex transient phenomena. The transient phenomena are not taken into account in the Preisach model and must therefore be eliminated. Elimination of these transient phenomena is not envisaged in the current characterization methods.

SUMMARY OF THE DISCLOSURE

The object of the invention is to remedy these drawbacks by proposing a method of characterization that allows the locally reversible phenomena and the transient phenomena due to wall displacements to be eliminated.

This object is achieved with a method for characterizing a ferroelectric material, comprising:

applying an electrical voltage to a sample of this ferroelectric material;

measuring the electrical current flowing through this sample; and jointly processing an applied voltage signal and a measured current signal, so as to provide representative data characterizing the polarization of the ferroelectric material.

According to the invention, the method furthermore includes:

feedback controlling the applied electrical voltage so as to superpose a first current component with what is called a "large-signal" first amplitude at a first frequency on a second current component with what is called a "small-signal" second amplitude at a second frequency very much higher than the first frequency; and identifying characteristics of the ferroelectric material that are associated with locally reversible polarization effects and with locally irreversible polarization effects, respectively.

The present invention proposes instrumentation that allows perfect extraction of the locally irreversible polarization and elimination of the transient phenomena due to the dynamics of domain wall displacements. An experimental determination of the Preisach density, requiring no a priori assumption, is then conceivable. This experimental Preisach density allows the ferroelectric material to be characterized independently of the amplitude of the applied electric field. The influence of certain phenomena due to the presence of defects can be readily observed, such as the fatigue of the material or the local imprint phenomenon.

Another aspect of the invention proposes a device for characterizing ferroelectric materials, implementing the method according to the invention, comprising:

means for applying an AC voltage to a sample of the ferroelectric material;

means for measuring the electrical current flowing through this sample;

means for jointly processing an applied voltage signal and a measured current signal, for providing representative data characterizing the polarization of the ferroelectric material, characterized in that it furthermore includes:

means for feedback controlling the applied electrical voltage so as to superpose a first current component with what is called a "large-signal" first amplitude at a first frequency on a second current component with what is called a "small-signal" second amplitude at a second frequency very much higher than the first frequency; and means for extracting the characteristics of the ferroelectric material that are associated with locally reversible polarization effects and with locally irreversible polarization effects, respectively, from the processing data.

BRIEF DESCRIPTION OF THE DRAWINGS

Other advantages and features of the invention will become apparent upon examining the detailed description of an entirely non-limiting embodiment and the appended drawings in which.

DETAILED DESCRIPTION

The principle of the characterization method according to the invention will now be described, at the same time as its implementation in a characterization apparatus, with reference to the aforementioned figures.

Figure 1:
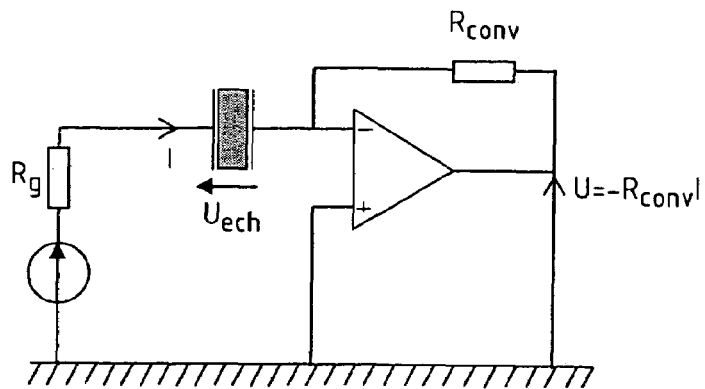
FIG. 1 illustrates a virtual ground circuit representative of the prior art.

To characterize a ferroelectric material, it is necessary to ensure that the voltage applied across the terminals of the sample, and the measurement of the current absorbed by the latter are perfectly controlled. When the voltage drop in the internal impedance of the generator can be neglected, a simple virtual ground circuit may be used, as in FIG. 1.

Figure 2:
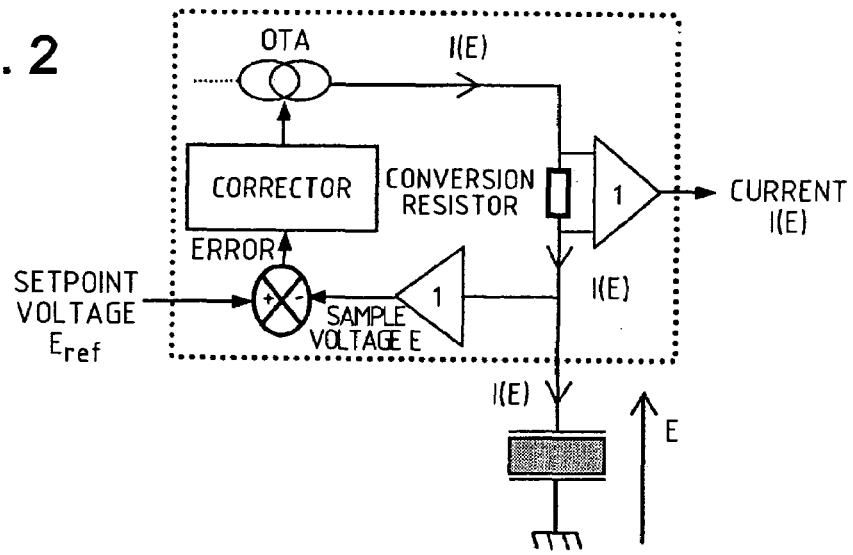
FIG. 2 illustrates the principle of feedback control of the voltage across the terminals of the sample and the measurement of the current absorbed by the latter, employed in the method according to the invention.

In the characterization method according to the invention, feedback control of the voltage is provided so as to allow high current absorption levels. One example of feedback control based on the use of a transconductance operational amplifier is shown in FIG. 2.

Therefore, the measurement system makes it possible to apply a certain voltage across the terminals of the ferroelectric sample, while measuring the current absorbed by the latter. This measurement system is the core of the instrumentation employed for determining the Preisach density.

The current measured during large-signal low-frequency cycles accounts for all the polarization effects, including the reversible and irreversible effects.

Figure 3:
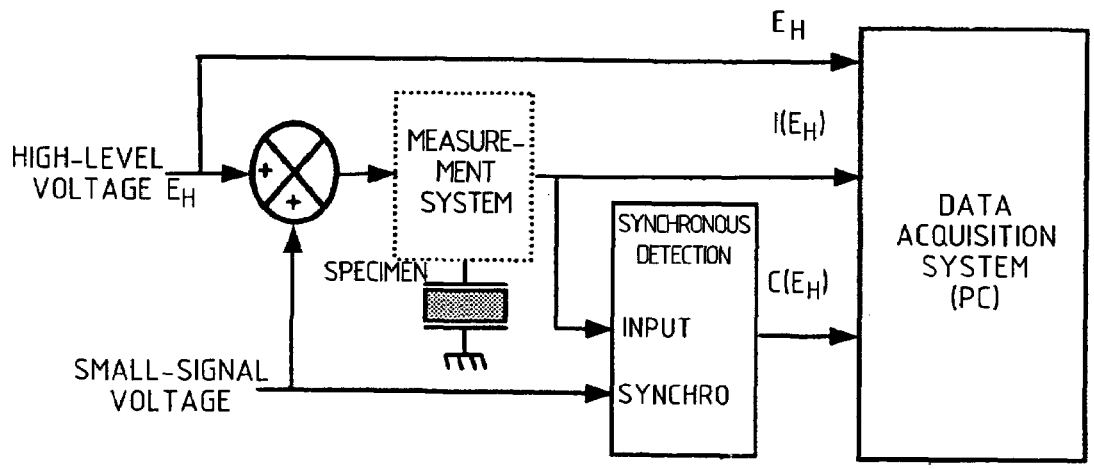
FIG. 3 shows a simultaneous measurement of the small-signal capacitance, of the current absorbed by a sample of ferroelectric material and of the voltage applied across its terminals, obtained with a characterization device according to the invention.

The locally reversible effects may be measured separately by superposing, on the large-signal voltage, a sinusoidal signal of very low amplitude but of high frequency. The small-signal capacitance is then measured at the same time by means of synchronous detection, as shown in FIG. 3.

The expression for the current absorbed by the sample is given by Equation 2. This current is split into several effects described by Equation 3, these being the locally irreversible polarization effects, the locally reversible effects and the effects due to the vacuum capacitance (which are also reversible):

$$I(E) = S \frac{d(\varepsilon_0 E + P(E))}{dt} \qquad (2)$$

$$I(E) = \left[ S\varepsilon_0 + S\frac{dP_{rev}(E)}{dE} + S\frac{dP_{irr}(E)}{dE} \right] \frac{dE}{dt} \qquad (3)$$

The current depends on the direction of variation of the field and, when the field is decreasing, on the last maximum field value reached, $E_{max}$. An expression for the current (Equation 4), in which the small-signal capacitance $C(E_{max}, E)$, the thickness h of the specimen, the area S of the sample and the saturation polarization $P_{sat}$ of the sample appear, is derived from Equation 3. The quantity $H_{dec}(E_{max}, E)$ is called the effective domain switching density and represents the locally irreversible effects:

$$I(E_{max}, E) = [hC(E_{max}, E) + 2P_{sat}SH_{dec}(E_{max}, E)] \frac{dE}{dt} \quad dE < 0 \qquad (4)$$

Figure 4:
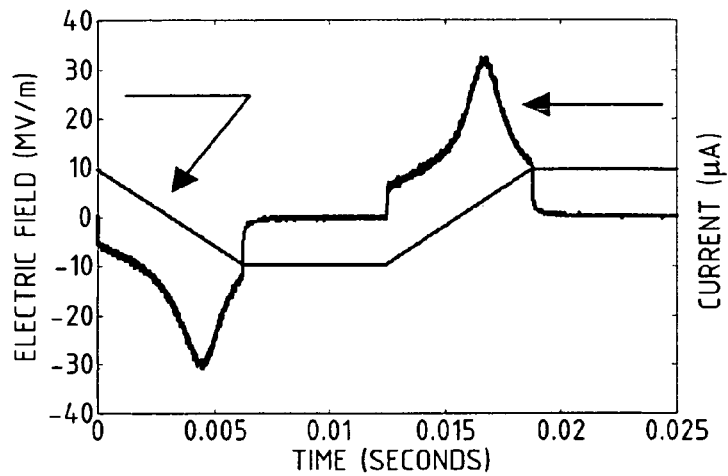
FIG. 4 illustrates the time variation of the current absorbed by the sample and the voltage applied across its terminals (showing a plateau at the ends)

Equation 4 does not incorporate the dynamics of domain wall displacement. This dynamics is the source of extremely irksome transient phenomena when there is a break in the electric field slope. The profile of the electric field applied to the sample is piecewise linear so as to make it easier to calculate dE/dt. The transient effects at the ends (when the field changes direction) are then eliminated by voltage plateaus, as in FIG. 4. These plateaus make it possible to wait until the transient phenomena due to the domain wall dynamics have terminated before starting the acquisition steps. This method makes it possible for the influence of the measurement frequency on the shape of the Preisach density to be virtually eliminated.

Figure 5:
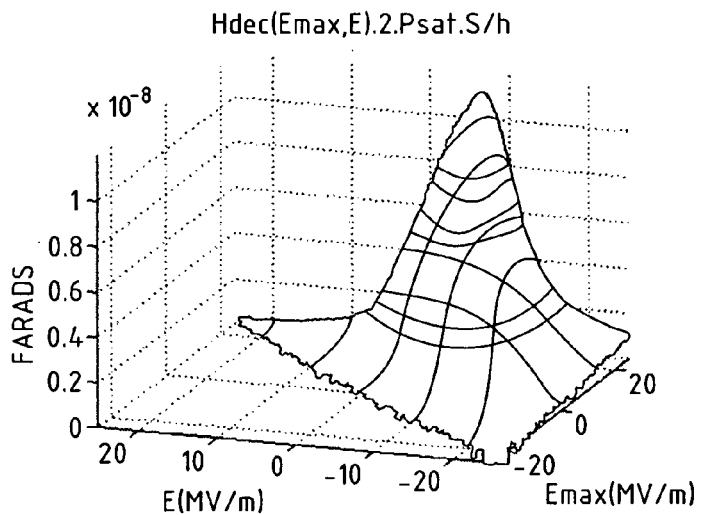
FIG. 5 illustrates effective domain switching densities plotted in the ($E_{max}$, E) plane that are obtained with a characterization device according to the invention.

FIG. 5 shows the measurements collected during determination of the effective domain switching density using the FORC method described in the aforementioned article "Mathematical models of hysteresis". This data is obtained after elimination of the transient effects and subtraction of the locally reversible effects.

Figure 6:
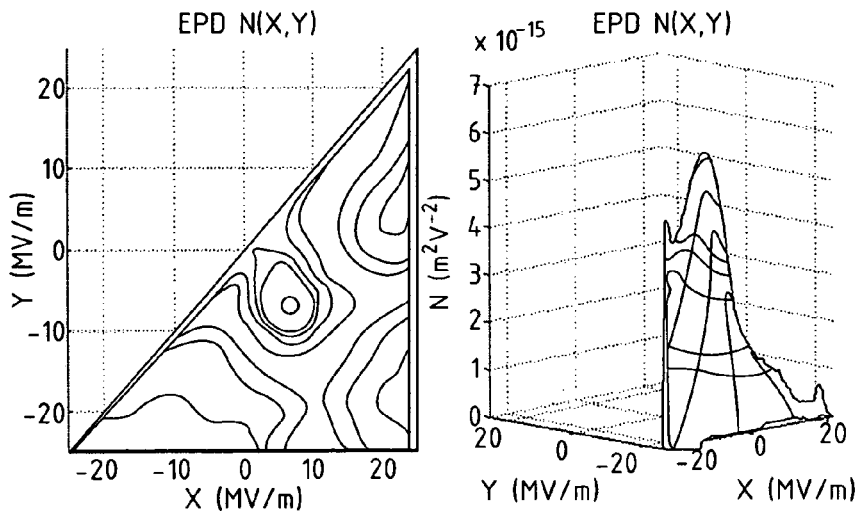
FIG. 6 illustrates an experimental Preisach density, in a top left view.

The relationship between the Preisach density N(X,Y) and this effective domain switching density is given by Mayergoyz (Equation 5). It is therefore possible, as shown in FIG. 6, for the Preisach density to be calculated from the data of FIG. 5 collected for various values of $E_{max}$.

$$N(E_{max}, E) = \frac{\partial H_{dec}(E_{max}, E)}{\partial E_{max}} \quad dE < 0 \qquad (5)$$

Of course, the invention is not limited to the examples that have just been described, it being possible for many modifications to be made to these examples without departing from the scope of the invention.

The invention claimed is:

1. A method for characterizing a ferroelectric material, comprising:
    applying an electrical voltage to a sample of this ferroelectric material;
    simultaneously measuring the small-signal capacitance of the sample;
    measuring the electrical current flowing through this sample; and
    jointly processing an applied voltage signal, a measured current signal and a small-signal capacitance signal, so as to provide representative data characterizing the polarization of the ferroelectric material, feedback controlling the applied electrical voltage so as to superpose a first current component having a "large-signal" first amplitude at a first frequency, and having plateaus at the ends, on a second current component having a "small-signal" second amplitude at a second frequency very much higher than the first frequency; and identifying characteristics of the ferroelectric material that are associated with locally reversible polarization effects and with locally irreversible polarization effects, respectively.

2. A device for characterizing ferroelectric materials, implementing the method according to the invention, comprising:

means for applying an AC voltage to a sample of the ferroelectric material;

means for measuring the electrical current flowing through this sample;

means for measuring the small-signal capacitance of this sample;

means for jointly processing an applied voltage signal, a measured current signal and a small-signal capacitance signal, means for providing representative data for characterizing the polarization of the ferroelectric material, means for feedback controlling the applied electrical voltage so as to superpose a first current component having a "large-signal" first amplitude at a first frequency, and having plateaus at the ends, on a second current component having a "small-signal" second amplitude at a second frequency very much higher than the first frequency; and means for extracting the characteristics of the ferroelectric material that are associated with locally reversible polarization effects and with locally irreversible polarization effects, respectively.

3. The device according to claim 2, wherein the voltage feedback control means comprise a transconductance operational amplifier.

* * * * *